United States Patent
Kang et al.

(10) Patent No.: US 9,143,087 B2
(45) Date of Patent: Sep. 22, 2015

(54) ADAPTIVE FM DEMODULATOR SUPPORTING MULTIPLE MODES

(71) Applicant: QUALCOMM Incorporated, San Diego, CA (US)

(72) Inventors: Eunmo Kang, San Diego, CA (US); Le Nguyen Luong, San Diego, CA (US); Yossef Tsfaty, Rishon-Le-Zion (IL)

(73) Assignee: QUALCOMM Incorporated, San Diego, CA (US)

( * ) Notice: Subject to any disclaimer, the term of this patent is extended or adjusted under 35 U.S.C. 154(b) by 21 days.

(21) Appl. No.: 14/083,900

(22) Filed: Nov. 19, 2013

(65) Prior Publication Data

US 2015/0137883 A1  May 21, 2015

(51) Int. Cl.
| | |
|---|---|
| H03D 3/00 | (2006.01) |
| H04L 27/14 | (2006.01) |
| H04L 27/148 | (2006.01) |
| H04L 27/152 | (2006.01) |
| H04B 1/16 | (2006.01) |

(52) U.S. Cl.
CPC ............. *H03D 3/006* (2013.01); *H03D 3/00* (2013.01); *H03D 3/001* (2013.01); *H04B 1/1646* (2013.01); *H04L 27/14* (2013.01); *H04L 27/148* (2013.01); *H04L 27/152* (2013.01); *H03D 2200/0045* (2013.01); *H03D 2200/0054* (2013.01)

(58) Field of Classification Search
CPC ..... H04L 27/14; H04L 27/152; H04L 27/148; H03D 3/006; H03D 3/241; H03D 3/001; H03D 2200/0045; H03D 2200/0054
USPC .......... 329/316, 315, 341, 325, 353; 375/324, 375/327, 328
See application file for complete search history.

(56) References Cited

U.S. PATENT DOCUMENTS

| | | | |
|---|---|---|---|
| 5,757,864 A * | 5/1998 | Petranovich et al. | 375/344 |
| 6,778,816 B1 * | 8/2004 | Ohno | 455/343.1 |
| 8,437,721 B2 | 5/2013 | Zeng et al. | |
| 8,498,349 B2 | 7/2013 | Balakrishnan et al. | |
| 2003/0022681 A1 | 1/2003 | Ruppel et al. | |
| 2008/0232480 A1 | 9/2008 | Tuttle et al. | |
| 2012/0269300 A1 * | 10/2012 | Krishnan et al. | 375/340 |
| 2013/0003792 A1 | 1/2013 | Hu et al. | |
| 2013/0029585 A1 | 1/2013 | Kroeger et al. | |

OTHER PUBLICATIONS

ISA/EPO, International Search Report and Written Opinion of the International Searching Authority, Int'l App. No. PCT/US2014/064759, Feb. 20, 2015, European Patent Office, Rijswijk, NL, 10 pgs.

* cited by examiner

*Primary Examiner* — Ryan Johnson
(74) *Attorney, Agent, or Firm* — Holland & Hart LLP

(57) ABSTRACT

Methods, systems, and devices are described for an adaptive demodulator that supports multiple modes. An FM signal may be received at a demodulator and parameters corresponding to the FM signal may be identified. Connections between multiple modules within the demodulator may be configured, based at least in part on the parameters, to select one of multiple demodulation modes supported by the demodulator to demodulate the FM signal. The modes may include a phase differencing mode, a phase-locked loop (PLL) mode, a frequency-compressive feedback (FCF) mode, and/or a quadrature detector mode. The parameters may include one or both of a signal strength of the FM signal and a maximum frequency deviation of the FM signal. Based on the parameters, one or more signals may be generated to configure the connections within the demodulator. A switch from one mode to another may occur when one of the parameters breaches a threshold value.

23 Claims, 12 Drawing Sheets

ADAPTIVE FM DEMODULATOR SUPPORTING MULTIPLE MODES

BACKGROUND

Over the past several decades, various demodulation algorithms have been developed for handling broadcast frequency-modulated (FM) audio and/or data transmissions. Each of these algorithms provides some level of performance that makes them particularly attractive solutions in some specific situations. The same algorithm, however, is not likely to provide an optimal solution for a wide range of operating conditions. That is, an FM demodulator generally relies on a single algorithm suited to handle the typical operating conditions that the FM demodulator is likely to face.

For example, an FM demodulator that is based on phase differencing may be implemented using a small layout (i.e., small silicon area) and may be operated without a significant amount of power consumption. Such FM demodulator, however, may have very poor receiver sensitivity and may only be practical to use it when the FM signal strength (e.g., signal-to-noise ratio (SNR) or signal-to-interference and noise ratio (SINR)) is sufficiently large.

On the other hand, an FM demodulator that is based on a phase-locked loop (PLL) scheme may need more silicon area and power consumption to implement than the FM demodulator that is based on phase differencing. However, the PLL-based FM demodulator may be able to achieve good receiver sensitivity. Like the PLL-based FM demodulator, an FM demodulator based on frequency-compressive feedback (FCF) may also provide good receiver sensitivity but also requires large silicon area and power consumption.

While a typical FM demodulation algorithm may not produce optimal performance for a wide range of operating conditions, using multiple FM demodulators, each based on a different FM demodulation algorithm, is both impractical and costly. Therefore, it is desirable to have a single FM demodulator that can provide the appropriate level of performance for a wide range of situations or operating conditions.

SUMMARY

The described features generally relate to one or more improved methods, apparatuses, devices, and/or systems for wireless communications. More particularly, the described features generally relate to wireless communications in which an FM receiver uses an adaptive FM demodulator that is capable of supporting multiple demodulation modes (e.g., algorithms).

One aspect of an adaptive FM demodulator supporting multiple modes includes receiving an FM signal (e.g., FM audio broadcast signal) at an FM demodulator and identifying one or more parameters corresponding to the FM signal. Based on those parameters, various connections between modules or blocks within the FM demodulator may be configured to select one of multiple demodulation modes supported by the demodulator to demodulate the FM signal. In some instances, the demodulation modes (e.g., demodulation algorithms) may include a phase differencing mode, a PLL mode, an FCF mode, and/or a quadrature detector mode. The parameters identified from the FM may include a signal strength metric (e.g., SNR, SINR) of the FM signal and/or a maximum frequency deviation or bandwidth used for transmission of the FM signal in a particular country and/or region of the world. Based on the parameters, one or more signals (e.g., control signals) may be generated to configure the connections within the FM demodulator. In some instances, operation of the FM demodulation may switch from one demodulation mode to another when one of the parameters breaches a threshold value (e.g., SNR of the FM signal is below a predefined threshold value).

According to at least one set of illustrative embodiments, a method for wireless communications may include: receiving a frequency modulated (FM) signal at a demodulator supporting multiple demodulation modes; identifying one or more parameters corresponding to the FM signal; and configuring, based at least in part on the one or more parameters, connections between multiple modules within the demodulator to select one of the multiple demodulation modes to demodulate the FM signal.

In certain examples, demodulation modes may include two or more of a phase differencing mode, a phase-locked loop (PLL) mode, a frequency-compressive feedback (FCF) mode, and a quadrature detector mode.

In certain examples, the one or more parameters may include one or both of a signal strength metric of the FM signal and a maximum frequency deviation of the FM signal.

In certain examples, the method may also include generating one or more signals based at least in part on the one or more parameters and configuring the connections between multiple modules within the demodulator for demodulating the FM signal based at least in part on the one or more signals.

In certain examples, the method may also include comparing one of the one or more parameters to a threshold value and switching the demodulation mode selection when the parameter breaches the threshold value.

In certain examples, the multiple demodulation modes may include a quadratic FM mode.

In certain examples, configuring connections between multiple modules within the demodulator may include selecting a phase differencing mode to demodulate the FM signal and configuring a signal processing path within the demodulator to demodulate the FM signal, where the signal processing path may include an arc tangent module and a phase differentiator.

In certain examples, configuring connections between multiple modules within the demodulator may include selecting a PLL mode to demodulate the FM signal and configuring a signal processing path within the demodulator to demodulate the FM signal, where the signal processing path may include a phase discriminator, a PLL loop filter, and a numerically-controlled oscillator (NCO).

In certain examples, configuring connections between multiple modules within the demodulator may include selecting an FCF mode to demodulate the FM signal and configuring a signal processing path within the demodulator to demodulate the FM signal, where the signal processing path may include a multiplier, an adaptive channel filter, an arc tangent module, a phase differentiator, and a numerically-controlled oscillator (NCO).

According to at least a second set of illustrative embodiments, an apparatus for wireless communications may include: means for receiving a frequency modulated (FM) signal at a demodulator supporting multiple demodulation modes; means for identifying one or more parameters corresponding to the FM signal; and means for configuring, based at least in part on the one or more parameters, connections between multiple modules within the demodulator to select one of the multiple demodulation modes to demodulate the FM signal.

In certain examples, the apparatus for wireless communications may implement one or more aspects of the method described above with respect to the first set of illustrative embodiments. For example, the apparatus may include means for implementing one or more of the examples described above with respect to the first set of illustrative embodiments.

According to at least a third set of illustrative embodiments, an apparatus for wireless communications may include: a processor; memory in electronic communication with the processor; and instructions stored in the memory. The instructions may be executable by the processor to: receive a frequency modulated (FM) signal at a demodulator supporting multiple demodulation modes; identify one or more parameters corresponding to the FM signal; and configure, based at least in part on the one or more parameters, connections between multiple modules within the demodulator to select one of the multiple demodulation modes to demodulate the FM signal.

In certain examples, the apparatus for wireless communications may implement one or more aspects of the method described above with respect to the first set of illustrative embodiments. For example, the memory may store instructions executable by the processor to implement one or more of the examples of the method described above with respect to the first set of illustrative embodiments.

According to at least a fourth set of illustrative embodiments, a computer program product for wireless communications may include a non-transitory computer readable medium. The non-transitory computer readable medium may store instructions executable by a processor to: receive a frequency modulated (FM) signal at a demodulator supporting multiple demodulation modes; identify one or more parameters corresponding to the FM signal; and configure, based at least in part on the one or more parameters, connections between multiple modules within the demodulator to select one of the multiple demodulation modes to demodulate the FM signal.

In certain examples, the computer program product for wireless communications may implement one or more aspects of the method described above with respect to the first set of illustrative embodiments. For example, the non-transitory computer readable medium may store instructions executable by the processor to implement one or more of the examples of the method described above with respect to the first set of illustrative embodiments.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Features which are believed to be characteristic of the concepts disclosed herein, both as to their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
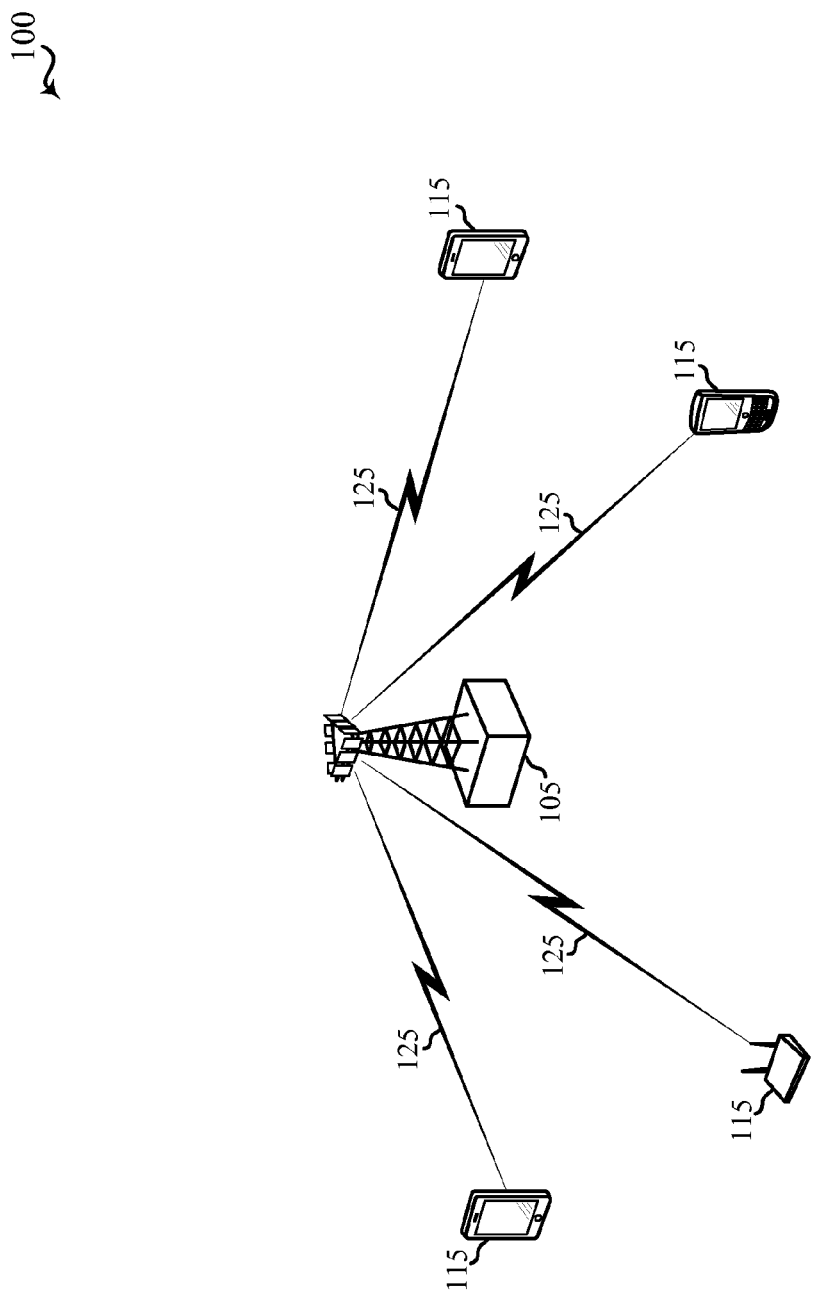
FIG. 1 shows a diagram that illustrates an example of FM broadcasting according to various embodiments.

Described embodiments are directed to methods, devices, and apparatuses for wireless communications in which an FM demodulator is suitable for a wide range of situations and operating conditions. The FM demodulator may support multiple demodulation modes (e.g., demodulation algorithms or schemes). Such FM demodulator may be referred to as an adaptable FM demodulator, a unified FM demodulator, or a configurable FM demodulator. For example, it may support a phase differencing mode, a PLL mode, and/or an FCF mode. In some instances, the FM demodulator may support other demodulation modes such as quadrature detector (e.g., quadractic detector FM demodulation). Once an FM signal is received, one or more parameters corresponding to the FM signal may be identified or estimated (e.g., SNR or SINR, maximum frequency deviation). Then, a configuration of the FM demodulator may be adapted or changed—based on one or more of the FM signal parameters—to select one of the supported demodulation modes and demodulate the FM signal using the selected mode.

The FM demodulator may combine or unify features from the architectures of different FM demodulators such as phase differencing FM demodulators, PLL-based FM demodulators, and/or FCF-based FM demodulators. A combined or unified implementation may be possible because the FM demodulators implemented from these algorithms may share one or more elements or components. As a result, an adaptive FM demodulator may be comparable in size to a PLL-based or FCF-based FM demodulator, but capable of operating in conditions suitable for an FM demodulator based on phase differencing.

The architecture of the adaptive FM demodulator may be configurable in order to obtain a preferred demodulation mode of operation. To adapt or configure the demodulator architecture, multiple control signals are generated according to parameters identified from the FM signal. For example, when SNR/SINR is large and it may be preferable for the FM demodulator to operate in a phase differencing mode, then the control signals may be adjusted to provide the appropriate internal configuration of the FM demodulator architecture. Similarly, when SNR/SINR drops or is low and it may be preferable for the FM demodulator to operate in a PLL mode or an FCF mode, the control signals may be adjusted accordingly.

By having a flexible or configurable architecture, an FM demodulator may be able to achieve both good performance in a low SNR/SINR environment (i.e., good receiver sensitivity) by, for example, using a PLL mode (i.e., PLL-based FM demodulator configuration) and small power consumption in a high SNR/SINR environment by, for example, using phase differencing mode (i.e., phase differencing FM demodulator configuration). Moreover, because the algorithms being implemented share common components (e.g., processing modules, processing blocks), the overall silicon area of a single, adaptive FM demodulator may be reduced when compared with implementing more than one FM demodulator separately.

The various techniques described herein for wireless communications are described with respect to FM broadcasting, particularly at very high frequency (VHF) broadcasting. However, the same or similar techniques may be used with FM broadcasting other than VHF and/or with different wireless communications networks, including wireless local area networks (WLAN) or Wi-Fi networks. WLAN or Wi-Fi networks may refer to a network that is based on the protocols described in the various IEEE 802.11 standards (e.g., IEEE 802.11a/g, 802.11n, 802.11ac, 802.11ah, etc.), for example. In addition, the same or similar techniques may also be used in any wireless network (e.g., a cellular network). For example, the same or similar techniques may be used for various wireless communications systems such as cellular wireless systems, Peer-to-Peer wireless communications, ad hoc networks, satellite communications systems, and other systems. The terms "system" and "network" are often used interchangeably. These wireless communications systems may employ a variety of radio communication technologies such as Code Division Multiple Access (CDMA), Time Division Multiple Access (TDMA), Frequency Division Multiple Access (FDMA), Orthogonal FDMA (OFDMA), Single-Carrier FDMA (SC-FDMA), and/or other radio technologies. Generally, wireless communications are conducted according to a standardized implementation of one or more radio communication technologies called a Radio Access Technology (RAT). A wireless communications system or network that implements a Radio Access Technology may be called a Radio Access Network (RAN).

Examples of Radio Access Technologies employing CDMA techniques include CDMA2000, Universal Terrestrial Radio Access (UTRA), etc. CDMA2000 covers IS-2000, IS-95, and IS-856 standards. IS-2000 Releases 0 and A are commonly referred to as CDMA2000 1X, 1X, etc. IS-856 (TIA-856) is commonly referred to as CDMA2000 1xEV-DO, High Rate Packet Data (HRPD), etc. UTRA includes Wideband CDMA (WCDMA) and other variants of CDMA. Examples of TDMA systems include various implementations of Global System for Mobile Communications (GSM). Examples of Radio Access Technologies employing OFDM and/or OFDMA include Ultra Mobile Broadband (UMB), Evolved UTRA (E-UTRA), Wi-Fi, IEEE 802.16 (WiMAX), IEEE 802.20, Flash-OFDM, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies.

Thus, the following description provides examples, and is not limiting of the scope, applicability, or configuration set forth in the claims. Changes may be made in the function and arrangement of elements discussed without departing from the spirit and scope of the disclosure. Various embodiments may omit, substitute, or add various procedures or components as appropriate. For instance, the methods described may be performed in an order different from that described, and various steps may be added, omitted, or combined. Also, features described with respect to certain embodiments may be combined in other embodiments.

Referring to FIG. 1, a diagram 100 illustrates a transmitter 105 that broadcasts RF signals 125 to one or more terminals, devices, or stations 115. The RF signals 125 include a carrier that is frequency-modulated by an audio and/or data signal being transmitted. Because of the frequency-modulated carrier, the RF signals 125 may also be referred to as FM signals or FM broadcast signals. The transmitter 105 may be a standalone broadcasting device or may be part of a base station or an access point used in different types of wireless communications networks (e.g., cellular networks, WLANs). In some embodiments, the transmitter 105 may be configured to perform FM broadcasting in VHF (e.g., band 8). In other embodiments, the transmitter 105 may be configured to perform FM sound broadcasting in other bands.

The transmitter 105 may be configured to perform monophonic transmissions and/or stereophonic transmissions. For monophonic transmissions, the RF signals include a carrier that is frequency-modulated by the sound signal being transmitted after the pre-emphasis of the sound signal. The maximum frequency deviation of the RF signal may depend on the country and/or region of transmission. For example, the maximum frequency deviation requirement may be ±75 kHz in the United States and in Western European countries, while for some Eastern European countries the maximum frequency deviation requirement may be ±50 kHz. For simplicity, a maximum frequency deviation of ±75 kHz or ±50 kHz may be referred to hereinafter as a maximum frequency deviation of 75 kHz or 50 kHz, respectively.

For stereophonic transmissions, a polar-modulation system or a pilot tone system may be used. In both systems, the RF signal may consist of a carrier that is frequency-modulated by a baseband signal, which may be referred to as a stereophonic multiplex signal. The maximum frequency deviation requirement in each of these systems may be 75 kHz in the United States and in Western European countries, and 50 kHz for some Eastern European countries.

When the transmitter 105 is part of a base station or an access point, one or more of the stations 115 may be configured to communicate bi-directionally with wireless communications networks (e.g., cellular networks, WLANs) supported by the base station or the access point.

The transmitter 105 may be configured to operate in a particular country or region and may support RF signal transmission using a maximum frequency deviation or bandwidth that corresponds to that country or region. The stations 115, however, may be configured to support one or more maximum frequency deviations (i.e., configured for use in different countries or regions) and may be able to identify which bandwidth is supported by the transmitter 105 and adapt its operation accordingly (e.g., adapt coefficients of a channel filter in an FM receiver).

The stations 115 may be mobile stations and/or stationary stations and may be distributed or deployed within a coverage area 120 of the transmitter 105. When a station 115 is a mobile station, it may also be referred to as a wireless station (STA), a wireless device, or a wireless terminal. The stations 115 may be configured to receive the RF signals 125 broadcast by the transmitter 105 and to process (e.g., demodulate) those signals to obtain an audio and/or data signal.

One or more of the stations 115 may support multiple demodulation modes (e.g., algorithm, schemes) and may be configured to select one of those modes as the appropriate mode for the current operating conditions. In some embodiments, a station may support a phase differencing demodulation mode, a PLL-based demodulation mode, an FCF-based demodulation mode, and/or a quadrature detector demodulation mode. The station may operate in one of the modes and then switch to another of the modes when a certain operating condition is met (e.g., a change in the strength of the RF signal). FIGS. 2-9 described below provide additional details on various aspects of having a station 115 in which an adaptive FM demodulator is used to support multiple demodulation modes.

Figure 2:
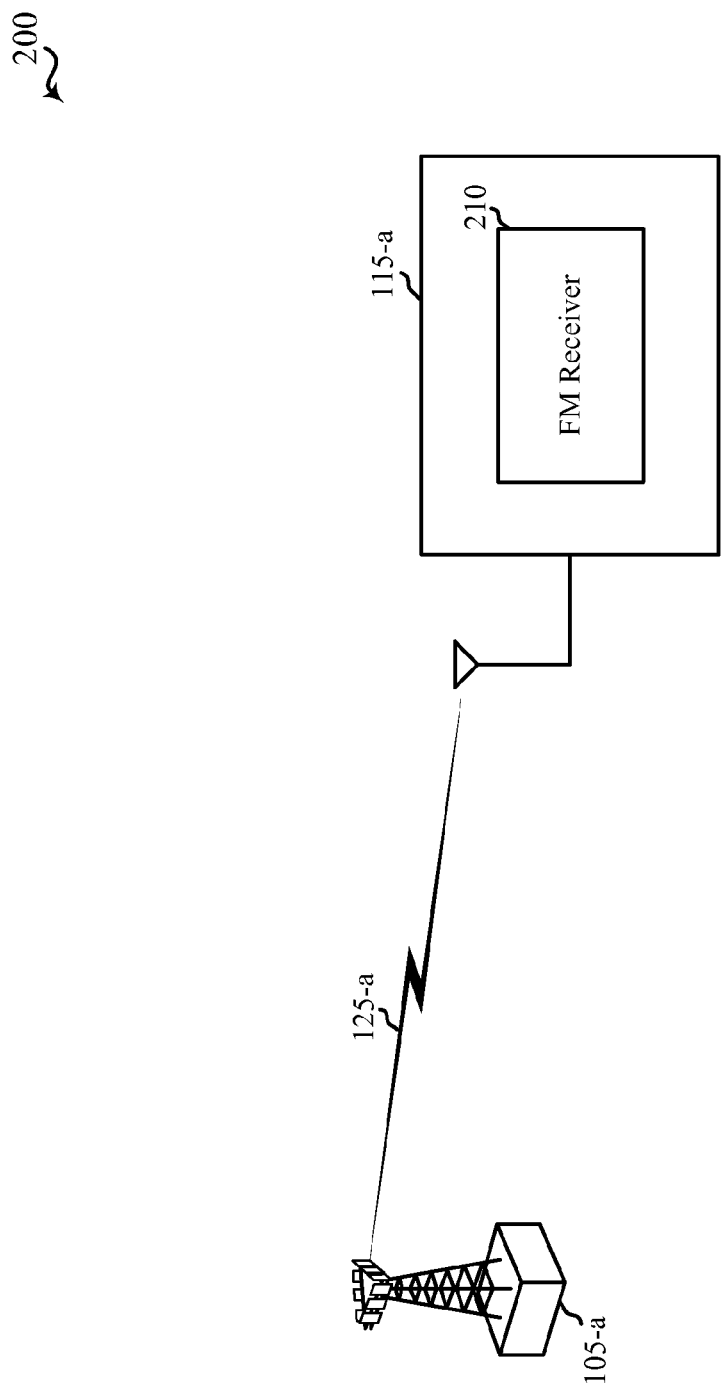
FIG. 2 shows a diagram that illustrates an example of a device with an FM receiver according to various embodiments.

FIG. 2 shows a diagram 200 in which a transmitter 105-a broadcasts RF signals 125-a with audio and/or data information to a station 115-a. The transmission is based on a particular maximum frequency deviation or bandwidth for the country or region in which the transmitter 105-a is located. The transmitter 105-a may be an example of the transmitter 105 in FIG. 1 and the station 115-a may be an example of the stations 115 also in FIG. 1.

The station 115-a may include an FM receiver 210 (e.g., digital FM receiver) that may be configured to process the RF signals 125-a to obtain the audio and/or data information by adapting a portion of the FM receiver 210. In some instances, the adaptation of the FM receiver 210 is based on the particular maximum frequency deviation being used for transmission of the RF signals 125-a and/or on a signal strength metric (e.g., SNR, SINR) of the RF signals 125-a. The processing of the RF signals 125-a may include a channel filtering operation and a demodulation operation, which are used to produce signals for an audio decoder (not shown) and/or for a Radio Data System (RDS) or Radio Broadcast Data System (RBDS) decoder (not shown) within the station 115-a.

The channel filtering operation may depend on the maximum frequency deviation being used for transmission of the RF signals 125-a. When the bandwidth used in the channel filtering operation is different from the transmission bandwidth, which results in sub-optimal channel filtering, the FM receiver 210 may be configured to modify the channel filtering operation bandwidth to be the same or similar to the transmission bandwidth to improve the filtering performance.

In one example of the channel filtering operation, the station 115-a may be configured (during operation and/or during manufacturing) to support maximum frequency deviations of 50 kHz, 75 kHz, and 100 kHz (as well as 22.5 kHz for receiver sensitivity tests). The station 115-a may also be configured to have a default or initial bandwidth value. In this example, the initial bandwidth supported is 50 kHz. The transmitter 105-a may transmit RF signals 125-a using a 75 kHz maximum frequency deviation. If the station 115-a were to perform its channel filtering operation at 50 kHz, the filtering performance would be sub-optimal. Instead, the station 115-a may identify (e.g., estimate) the maximum frequency deviation being used for transmission of the RF signals 125-a and may change the channel filtering operation (e.g., change filter coefficients) according to the maximum frequency deviation identified in order to improve filtering performance. In this instance, the station 115-a may adjust its operation to support a 75 kHz maximum frequency deviation like the one being used for transmission of the RF signals 125-a by the transmitter 105-a.

In another example of the channel filtering operation, the station 115-a may be configured (during operation and/or during manufacturing) to support maximum frequency deviations of 50 kHz, 75 kHz, and 100 kHz (as well as 22.5 kHz for receiver sensitivity tests). The station 115-a may also be configured to have a default or initial bandwidth value. In this example, the initial bandwidth supported is 50 kHz. The transmitter 105-a may transmit RF signals 125-a using a 60 kHz maximum frequency deviation. If the station 115-a were to perform its channel filtering operation at 50 kHz, the filtering performance would be sub-optimal. Instead, the station 115-a may identify (e.g., estimate) the maximum frequency deviation being used for transmission of the RF signals 125-a and may change the channel filtering operation (e.g., change filter coefficients) according to the maximum frequency deviation identified in order to improve filtering performance. In this instance, the station 115-a does not support 60 kHz, but supports 50 kHz and 75 kHz. The station 115-a may then decide whether to continue its channel filtering operation based on 50 kHz or whether adapting its channel filtering operation to 75 kHz may improve performance. In some cases, the station 115-a may be configured to modify the 50 kHz operation or the 75 kHz operation to produce channel filtering performance that is nearly optimal for the 60 kHz being used by the transmitter 105-a.

As noted above, the demodulation operation may depend on the maximum frequency deviation being used for transmission of the RF signals 125-a and/or on a signal strength metric of the RF signals 125-a. For example, when SNR/SINR of the RF signals 125-a is large (e.g., greater than a threshold value) and it may be preferable for the demodulation operation to use a phase differencing mode, then the FM receiver 210 may be adjusted to provide the appropriate internal configuration to perform demodulation based on the phase differencing mode. Similarly, when SNR/SINR of the RF signals 125-a drops or is low (e.g., less than a threshold value) and it may be preferable for the FM receiver 210 to operate in a PLL mode or an FCF mode, then the FM receiver 210 may be adjusted to provide the appropriate internal configuration to perform demodulation based on one of those modes. In addition, a particular mode may be more appropriate for a maximum frequency deviation and the FM receiver 210 may be adjusted or adapted accordingly.

The examples described above with respect to FIG. 2 are provided by way of illustration and not of limitation. The station 115-a, and similar devices, may support more or fewer maximum frequency deviations and/or more or fewer demodulation modes from those described above. Additional details on various aspects of adapting an internal configuration of an FM demodulator to handle multiple demodulation modes (e.g., algorithms, schemes) are provided below with respect to FIGS. 3-9.

Figure 3:
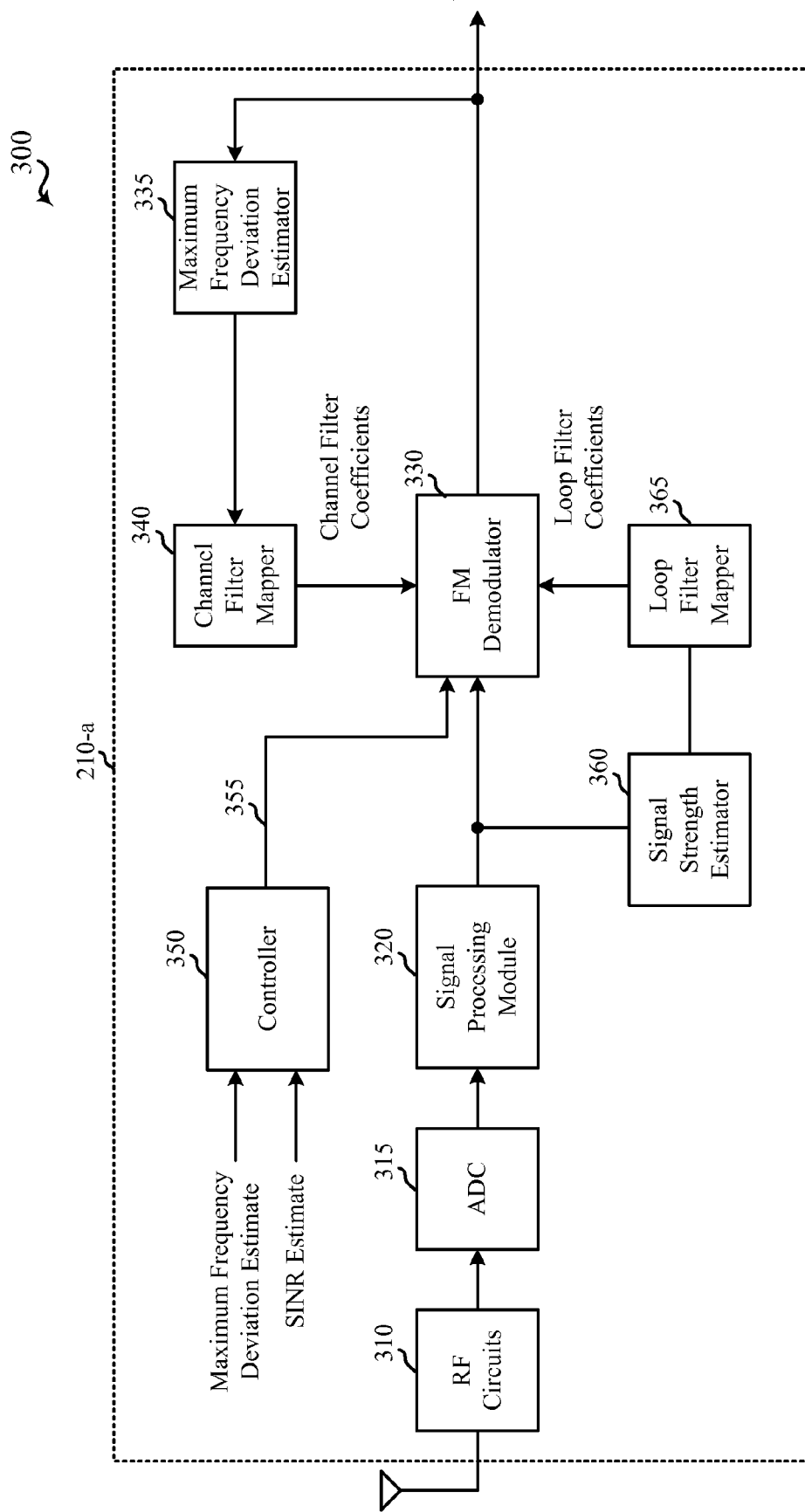
FIG. 3 shows a diagram that illustrates an example of an FM receiver according to various embodiments.

Referring to FIG. 3, a diagram 300 that includes an FM receiver 210-a that may be an example of the FM receiver 210 of FIG. 2 is shown. The FM receiver 210-a may include RF circuits 310, an analog-to-digital converter (ADC) 315, a signal processing module 320, and an FM demodulator 330. The FM receiver 210-a may also include a maximum frequency deviation estimator 335, a channel filter mapper 340, a controller 350, an signal strength estimator 360, and a loop filter mapper 365.

The FM receiver 210-a may be configured to receive RF signals having audio and/or data information and to perform front-end processing of those signals using the RF circuits 310, the ADC 315, and the signal processing module 320. The signal processing module 320, for example, may be configured to perform front-end filtering and/or removal of DC offset, spurs, and/or in-phase/quadrature (I/Q) imbalance.

The channel filter 325 may be configured to filter out-of-band noise from the received RF signals. The channel filter 325 may be adaptable or configurable. For example, the channel filter 325 may use filter coefficients that define the filtering operation and those filter coefficients may be adapted, adjusted, changed, or modified by the filter mapper 340 based at least in part on a maximum frequency deviation associated with the RF signals received by the FM receiver 210-a.

The FM demodulator 330 may be configured to demodulate the RF signals. The FM demodulator 330 may support multiple demodulation modes (e.g., algorithms, schemes) and may be configured to select one of the modes based at least in part on the current operating conditions. The FM demodulator 330 may support, for example, a phase differencing demodulation mode, a PLL-based demodulation mode, an FCF-based demodulation mode, and/or a quadrature detector demodulation mode.

The FM demodulator 330 may include a channel filter (not shown) and a PLL loop filter (not shown). Examples of the channel filter and the PLL loop filter are described below with respect to FIG. 4A. The channel filter may be used to filter out-of-band noise of the RF signals received by the FM receiver 210-a. The channel filter may use filter coefficients that define the filtering operation and those filter coefficients may be adapted, adjusted, changed, or modified by the channel filter mapper 340 based at least in part on a maximum frequency deviation estimate produced by the maximum frequency deviation estimator 335. The PLL loop filter may be used as part of a PLL-based demodulation mode when such a mode is selected for demodulating the signals received by the FM receiver 210-a. The PLL loop filter may use filter coefficients that define the filtering operation and those filter coefficients may be adapted, adjusted, changed, or modified by the loop filter mapper 365 based at least in part on a RF signal strength estimate produced by the signal strength estimator 360.

The output of the FM demodulator 330 may be provided to an audio decoder (not shown) and/or to RDS or RBDS decoder (not shown) for further processing. The output of the FM demodulator 330 may also be provided to the maximum frequency deviation estimator 335, which may be configured to estimate at least a maximum frequency deviation and to provide the estimate to the channel filter mapper 340. In some embodiments, the maximum frequency deviation estimator 335 may also be configured to estimate a maximum frequency deviation estimate from the output of the FM demodulator 330 and to provide the error estimate to the channel filter mapper 340. The maximum frequency deviation estimator 335 may be configured to estimate the maximum frequency deviation in the time domain and/or in the frequency domain.

The channel filter mapper 340 may be configured to identify a set of (filter) coefficients to apply to the channel filter in the FM demodulator 330. The set of filter coefficients may be identified based at least on the maximum frequency deviation estimate from the maximum frequency deviation estimator 335. In some instances, the channel filter mapper 340 may also take into account the variance of a maximum frequency deviation estimate when one is provided by the maximum frequency deviation estimator 335. The channel filter mapper 340 may use the maximum frequency deviation estimate (and the variance) to select one set of coefficients from multiple sets available in memory (e.g., in a look-up table (LUT)). Each of the sets available in memory may correspond to a particular maximum frequency deviation and may be pre-defined (e.g., computed off-line). A particular set may be selected for application to the channel filter in the FM demodulator 330 when the maximum frequency deviation estimate is the same or close to the maximum frequency deviation corresponding to that set.

The channel filter mapper 340 may be configured to modify the values of one or more coefficients in a set. For example, the number of sets available in memory may be limited and the maximum frequency deviation that is estimated by the maximum frequency deviation estimator 335 may not directly correspond to any of the sets available. In this case, the channel filter mapper 340 may select one of the sets (e.g., one with a corresponding maximum frequency deviation that is closest to the estimate) and may apply that set to the channel filter in the FM demodulator 330. In another example, the channel filter mapper 340 may instead modify the value of one or more of the coefficients in the selected set such that the performance of the modified set is optimal or near-optimal for the maximum frequency deviation estimated by the maximum frequency deviation estimator 335. The channel filter mapper 340 may be configured to perform a gradient descent-based optimization, or some other first-order or higher-order optimization algorithm, to adjust or adapt the values of one or more of the coefficients in a set.

The loop filter mapper 365 may be configured to identify a set of (filter) coefficients to apply to the PLL loop filter in the FM demodulator 330. The set of filter coefficients may be identified based at least in part on the SINR (or SNR) estimate from the signal strength estimator 360. The loop filter mapper 365 may use the SINR estimate to select one set of coefficients from multiple sets available in memory (e.g., in an LUT). Each of the sets available in memory may correspond to a particular SINR and may be pre-defined (e.g., computed off-line). A particular set may be selected for application to the PLL loop filter in the FM demodulator 330 when the SINR estimate is the same or close to SINR corresponding to that set.

The loop filter mapper 365 may be configured to modify the values of one or more coefficients in a set. For example, the number of sets available in memory may be limited and the SINR that is estimated by the signal strength estimator 360 may not directly correspond to any of the sets available. In this case, the loop filter mapper 365 may select one of the sets (e.g., one with a corresponding SINR that is closest to the estimate) and may apply that set to the PLL loop filter in the FM demodulator 330. In another example, the loop filter mapper 365 may instead modify the value of one or more of the coefficients in the selected set such that the performance of the modified set is optimal or near-optimal for the SINR estimated by the signal strength estimator 360. The loop filter mapper 365 may be configured to perform a gradient descent-based optimization, or some other first-order or higher-order optimization algorithm, to adjust or adapt the values of one or more of the coefficients in a set.

The controller 350 may be configured to control and/or select operational features of the FM demodulator 330. The controller 350 may also be configured to control and/or select operational features of the maximum frequency deviation estimator 335, the channel filter mapper 340, the signal strength estimator 360, and/or the loop filter mapper 365.

The controller 350 may be used to identify parameters associated with the signals received by the FM receiver 210-a and use those parameters to determine which of the demodulation modes supported by the FM demodulator 330 to select for demodulating signals produced by the signal processing module 320. For example, when the SINR (or SNR) estimate from the signal strength estimator 360 is large (e.g., above a threshold value), and it may be preferable for the FM demodulator 330 to operate in a phase differencing mode, the controller 350 may generate one or more control signals 355 that may adjust the internal configuration of the FM demodulator 330 to operate in the phase differencing mode. Similarly, when the SINR (or SNR) estimate from the signal strength estimator 360 drops or is low (e.g., below a threshold value), and it may be preferable for the FM demodulator 330 to operate in a PLL demodulation mode or an FCF demodulation mode, the controller 350 may generate one or more control signals 355 that may adjust the internal configuration of the FM demodulator 330 accordingly.

The controller 350 may also use the maximum frequency deviation estimate produced by the maximum frequency deviation estimator 335 to determine which of the demodulation modes supported by the FM demodulator 330 to select for demodulating signals produced by the signal processing module 320. For example, one or more of the demodulation modes may be suitable for a particular maximum frequency deviation estimate and the controller 350 may be configured to control the internal configuration of the FM demodulator 330 accordingly.

Figure 4A:
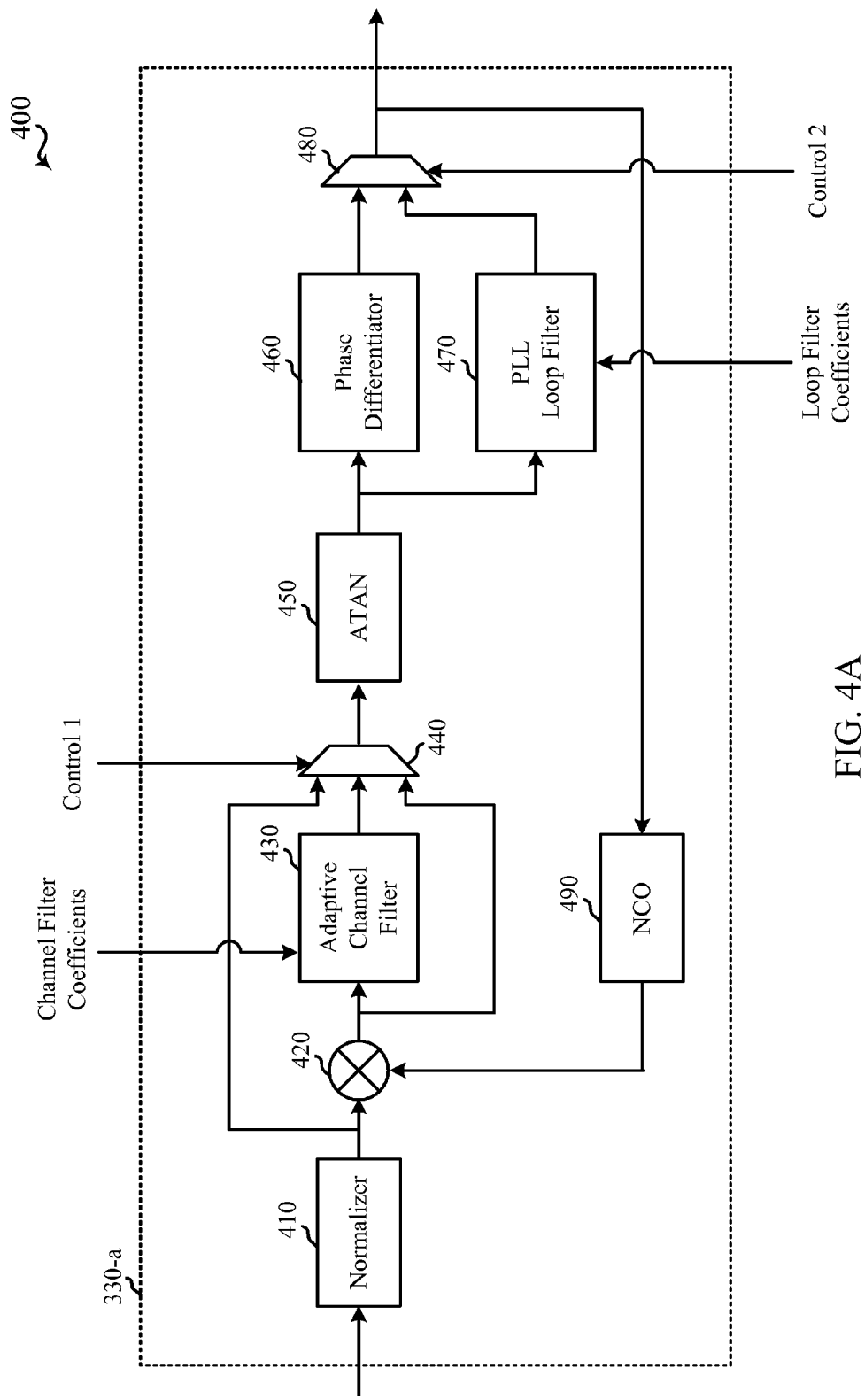
FIG. 4A shows a diagram that illustrates an example of an adaptive FM demodulator according to various embodiments.

In FIG. 4A, a diagram 400 is shown that includes an FM demodulator 330-a that may be an example of the FM demodulator 330 of FIG. 3. The FM demodulator 330-a may include a normalizer 410, a multiplier 420, an adaptive channel filter 430, a first switch or selector 440, an arctangent (ATAN) module 450, a phase differentiator 460, a PLL loop filter 470, a second switch or selector 480, and a numerically-controlled oscillator (NCO) 490.

The adaptive channel filter 430 may be an example of the channel filter in the FM demodulator 330 described above with respect to FIG. 3. Similarly, the PLL loop filter 470 may be an example of the PLL loop filter in the FM demodulator described above with respect to FIG. 3. The adaptive channel filter 430 may receive filter coefficients from, for example, the channel filter mapper 340, and the PLL loop filter 470 may receive filter coefficients from, for example, the loop filter mapper 365.

Figure 4B:
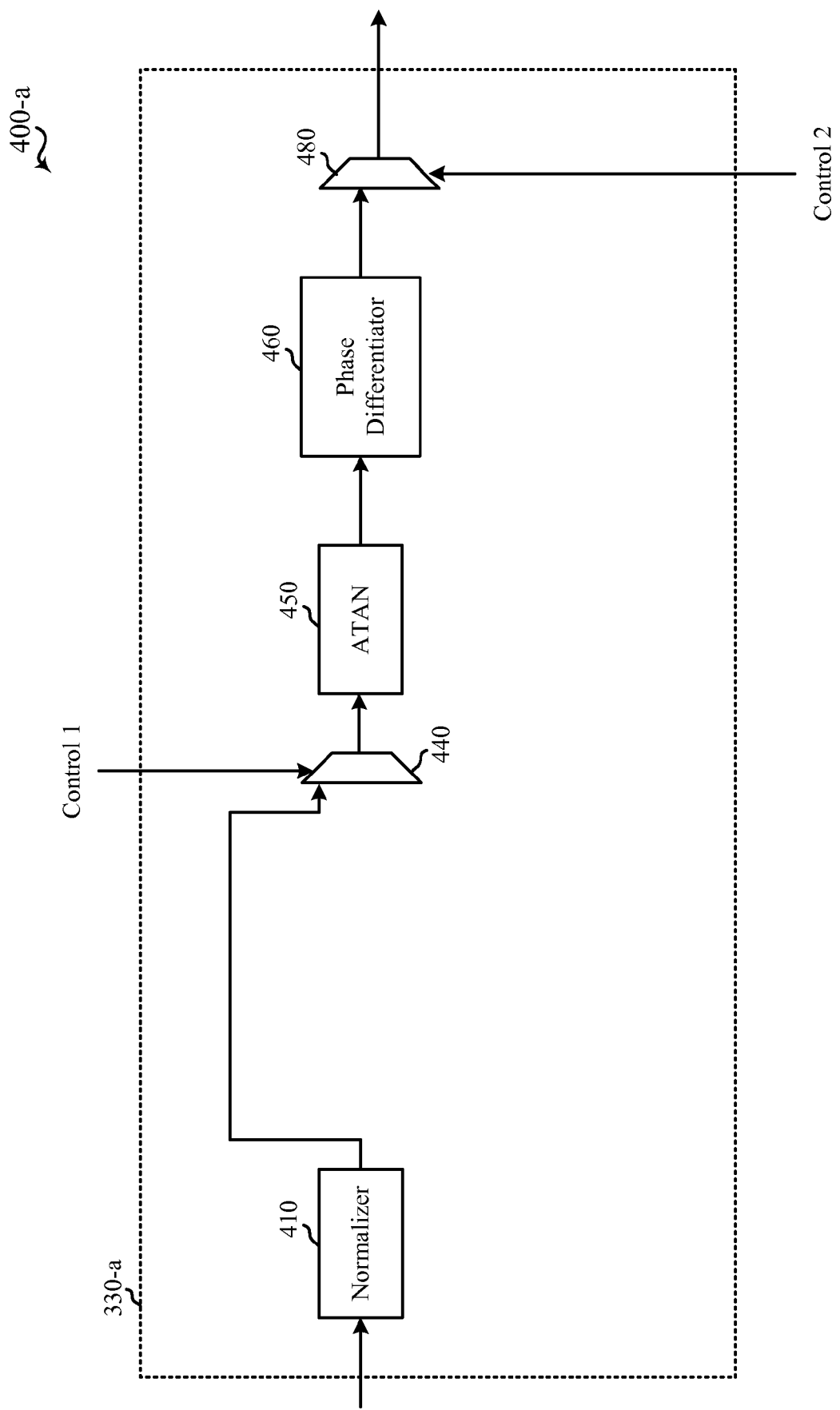
FIG. 4B shows a diagram that illustrates an example of a configuration of the adaptive FM demodulator according to various embodiments.
Figure 4C:
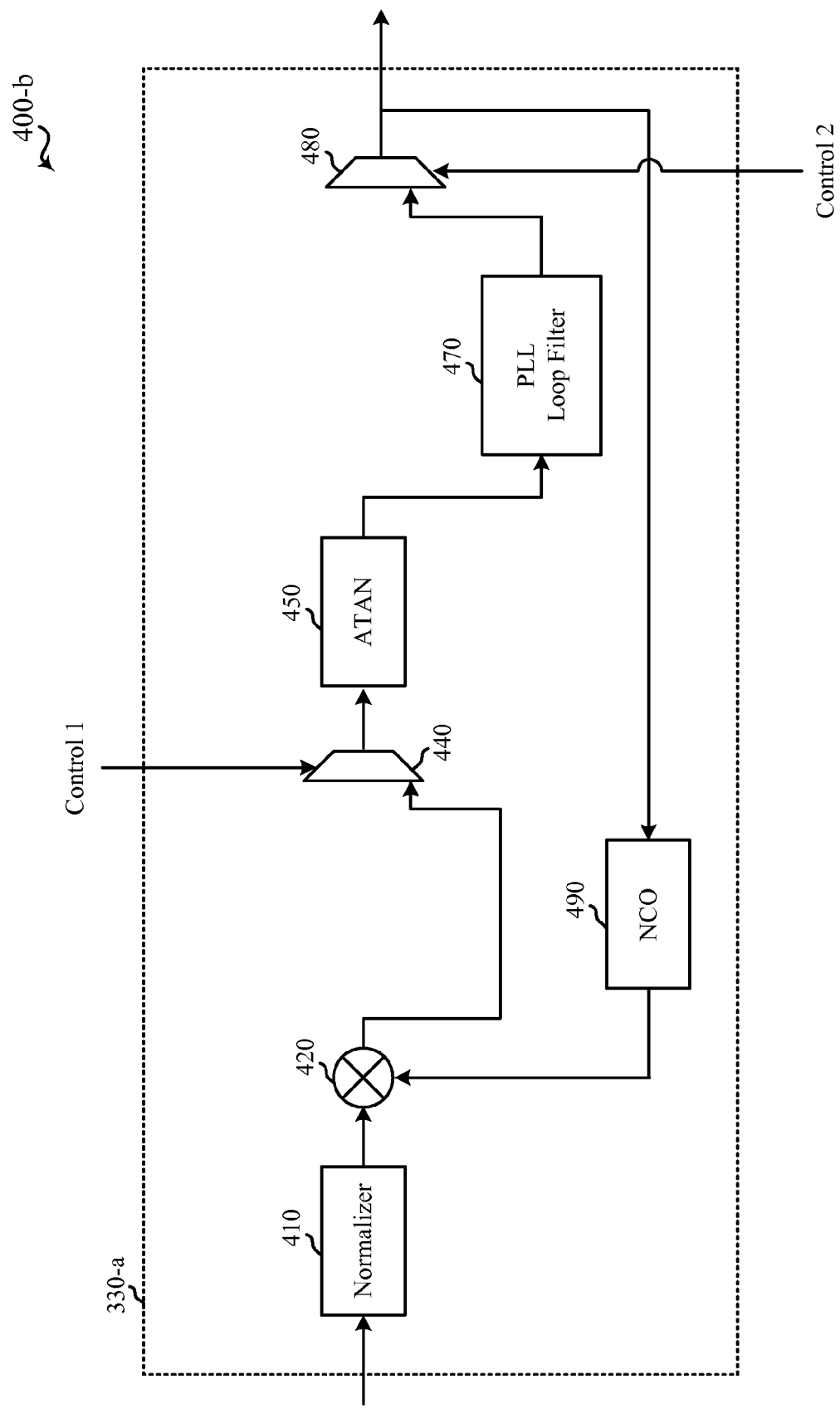
FIG. 4C shows a diagram that illustrates another example of a configuration of the adaptive FM demodulator according to various embodiments.

The first switch 440 may be configured to select one of the output of the normalizer 410, the output of the multiplier 420, and the output of the adaptive channel filter 430 to provide as input to the ATAN module 450. In this regard, the first switch 440 may receive a control signal (Control 1), which may be an example of the one or more control signals 355 generated by the controller 350 of FIG. 3. The second switch 480 may be configured to select on of the output of the phase differentiator 460 and the output of the PLL loop filter 470 as output of the FM demodulator 330-a. In this regard, the second switch 480 may receive a control signal (Control 2), which may be an example of the one or more control signals 355 generated by the controller 350 of FIG. 3. Based at least in part on the control signals used with the first switch 440 and the second switch 480, the internal connections between modules or components of the FM demodulator 330-a (e.g., internal configuration) may be adjusted to select one of the various demodulation modes supported by the FM demodulator 330. FIGS. 4B-4C describe examples of internal connections using the first switch 440 and the second switch 480 to implement different demodulation modes.

Referring to FIG. 4B, there is shown a diagram 400-a that illustrates the FM demodulator 330-a configured in a phase differencing demodulation mode. In this embodiment, Control 1 is used to select the output of the normalizer 410 as input to the ATAN module 450 and Control 2 is used to select the output of the phase differentiator 460 as the output of the FM demodulator 330-a. Thus, when configured to operate in the phase differencing demodulation mode, the processing path of the FM demodulator 330 may include the normalizer 410 in communication with the ATAN module 450 through the first switch 440, the ATAN module 450 in communication with the phase differentiator 460, and the output of the phase differentiator 460 being the output of the FM demodulator 330-a through the second switch 480.

FIG. 4C shows a diagram 400-b that illustrates the FM demodulator 330-a configured in a PLL-based demodulation mode. In this embodiment, Control 1 is used to select the output of the multiplier 420 as input to the ATAN module 450 and Control 2 is used to select the output of the PLL loop filter 470 as the output of the FM demodulator 330-a. Thus, when configured to operate in the PLL-based demodulation mode, the processing path of the FM demodulator 330 may include the normalizer 410 in communication with the multiplier 420, the multiplier 420 in communication with the ATAN module 450 through the first switch 440, the ATAN module 450 in communication with the PLL loop filter 470, the PLL loop filter 470 in communication with the NCO 490 through the second switch 480, and the NCO 490 in communication with the multiplier 420. In this configuration, the output of the PLL loop filter 470 is the output of the FM demodulator 330-a through the second switch 480.

The multiplier 420 and the ATAN module 450 may constitute a phase discriminator. Those skilled in the art will recognize that phase discrimination may be performed in a variety of ways. For example, phase discrimination may be performed with a multiplier and a module configured to extract the imaginary portion of a multiplier output signal.

Figure 4D:
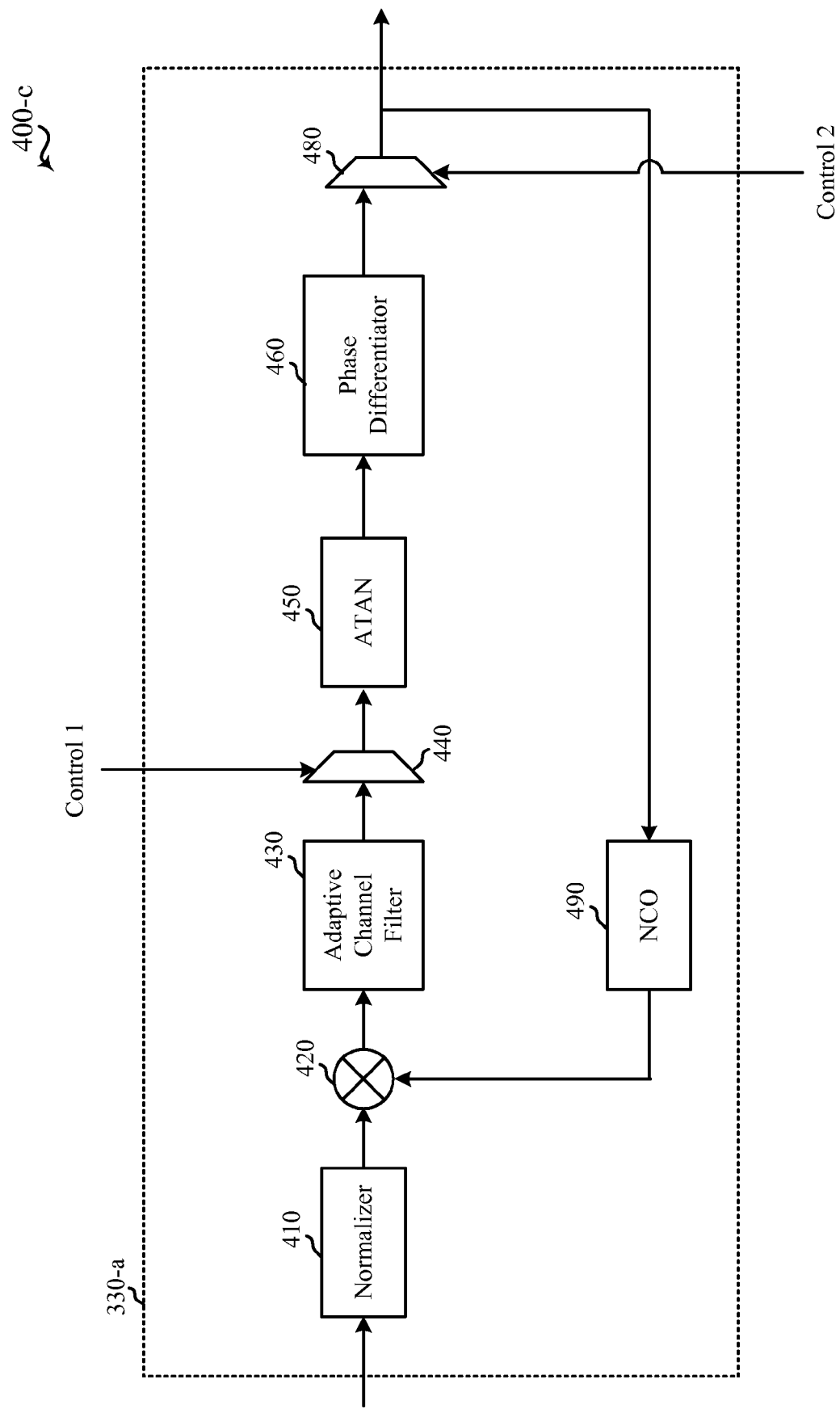
FIG. 4D shows a diagram that illustrates yet another example of a configuration of the adaptive FM demodulator according to various embodiments.

Referring to FIG. 4D, there is shown a diagram 400-c that illustrates the FM demodulator 330-a configured in a FCF-based demodulation mode. In this embodiment, Control 1 is used to select the output of the adaptive channel filter 430 as input to the ATAN module 450 and Control 2 is used to select the output of the phase differentiator 460 as the output of the FM demodulator 330-a. Thus, when configured to operate in the FCF-based demodulation mode, the processing path of the FM demodulator 330 may include the normalizer 410 in communication with the multiplier 420, the multiplier 420 in communication with the adaptive channel filter 430, the adaptive channel filter 430 in communication with the ATAN module 450 through the first switch 440, the ATAN module 450 in communication with the phase differentiator 460, the phase differentiator 460 in communication with the NCO 490 through the second switch 480, and the NCO 490 in communication with the multiplier 420. In this configuration, the output of the phase differentiator 460 is the output of the FM demodulator 330-a through the second switch 480.

The examples in FIGS. 4B-4D above are not limiting and are provided by way of illustration. The configurations in those examples may also support demodulation algorithms or schemes different from those described above. For instance, certain configurations may not include a normalizer. Other implementations may also be possible that configure the connections between modules or components of the FM demodulator 330-a to select one of multiple demodulation modes.

Figure 5:
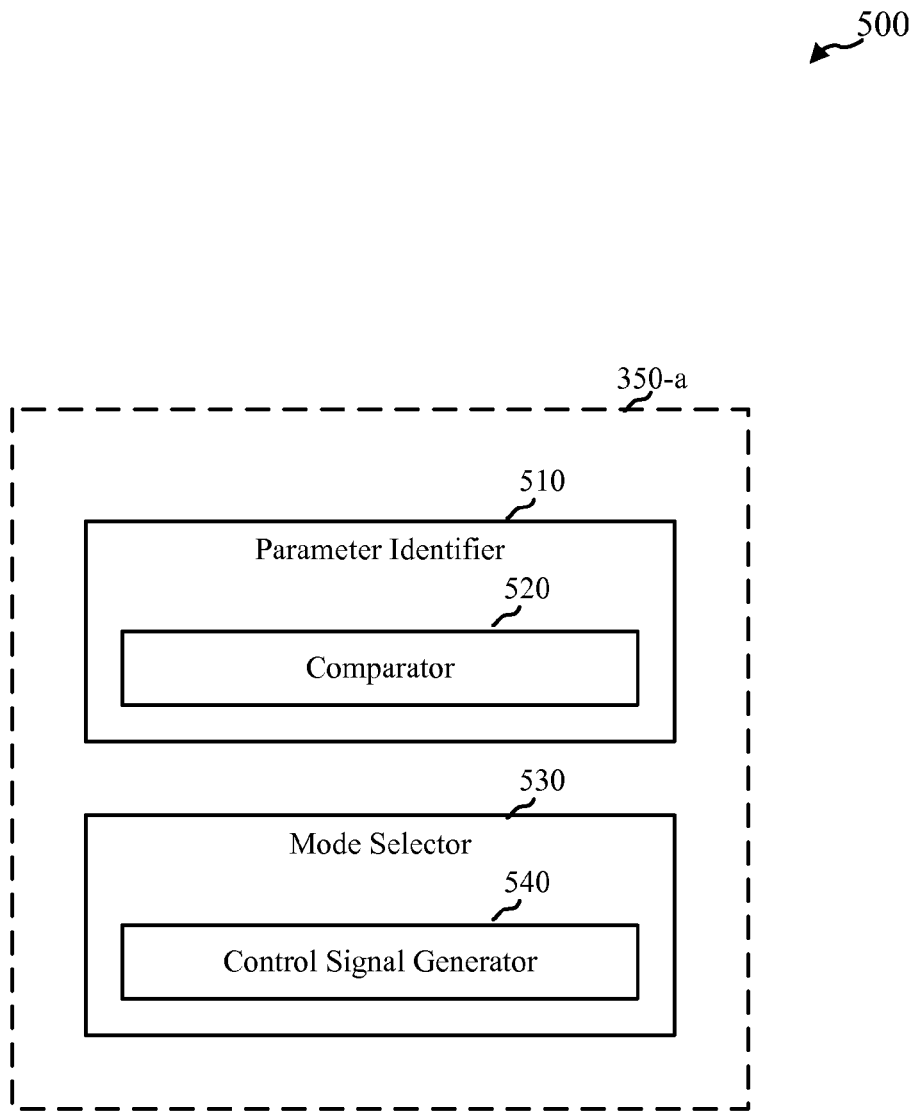
FIG. 5 shows a diagram that illustrates an example of a controller for configuring an adaptive FM demodulator according to various embodiments.

FIG. 5 shows a diagram 500 that includes a controller 350-a that may be an example of the controller 350 of FIG. 3. The controller 350-a may include a parameter identifier 510 and a mode selector 530. The parameter identifier 510 may include a comparator 520 and the mode selector 530 may include a control signal generator 540.

The parameter identifier 510 may be configured to identify one or more parameters (e.g., maximum frequency deviation, SNR/SINR) corresponding to an FM signal received by an FM receiver (e.g., FM receiver 210). The comparator 520 may be configured to compare one or more of the identified parameters to a pre-defined threshold value to determine whether a change of demodulation mode is needed based on operating conditions. For example, the comparator 520 may compare an SNR or SINR estimate to a threshold value to determine whether the SNR or SINR estimate is greater than or less than the threshold value. In some embodiments, the SNR or SINR estimate may be compared to two or more threshold values.

The mode selector 530 may be configured to select a demodulation mode from multiple supported demodulation modes based at least in part on the parameters identified by the parameter identifier 510. The mode selector 530 may select a demodulation mode when the comparator 520 indicates that the SNR or SINR estimate is greater than a threshold value and may select a different demodulation mode when the comparator 520 indicates that the SNR or SINR estimate is less than the same threshold value (or less than another threshold value). The mode selector 530 may also select a demodulation mode based on a maximum frequency deviation estimate. The mode selector 530 may used both an SNR or SINR estimate and a maximum frequency deviation estimate to select a demodulation mode.

The control signal generator 540 may be configured to generate one or more control signals (e.g., control signals 355, Control 1, Control 2) to configure the connections between modules or components in an FM demodulator (e.g., FM demodulator 330) to select one of the multiple demodulation modes supported by the FM demodulator.

Figure 6:
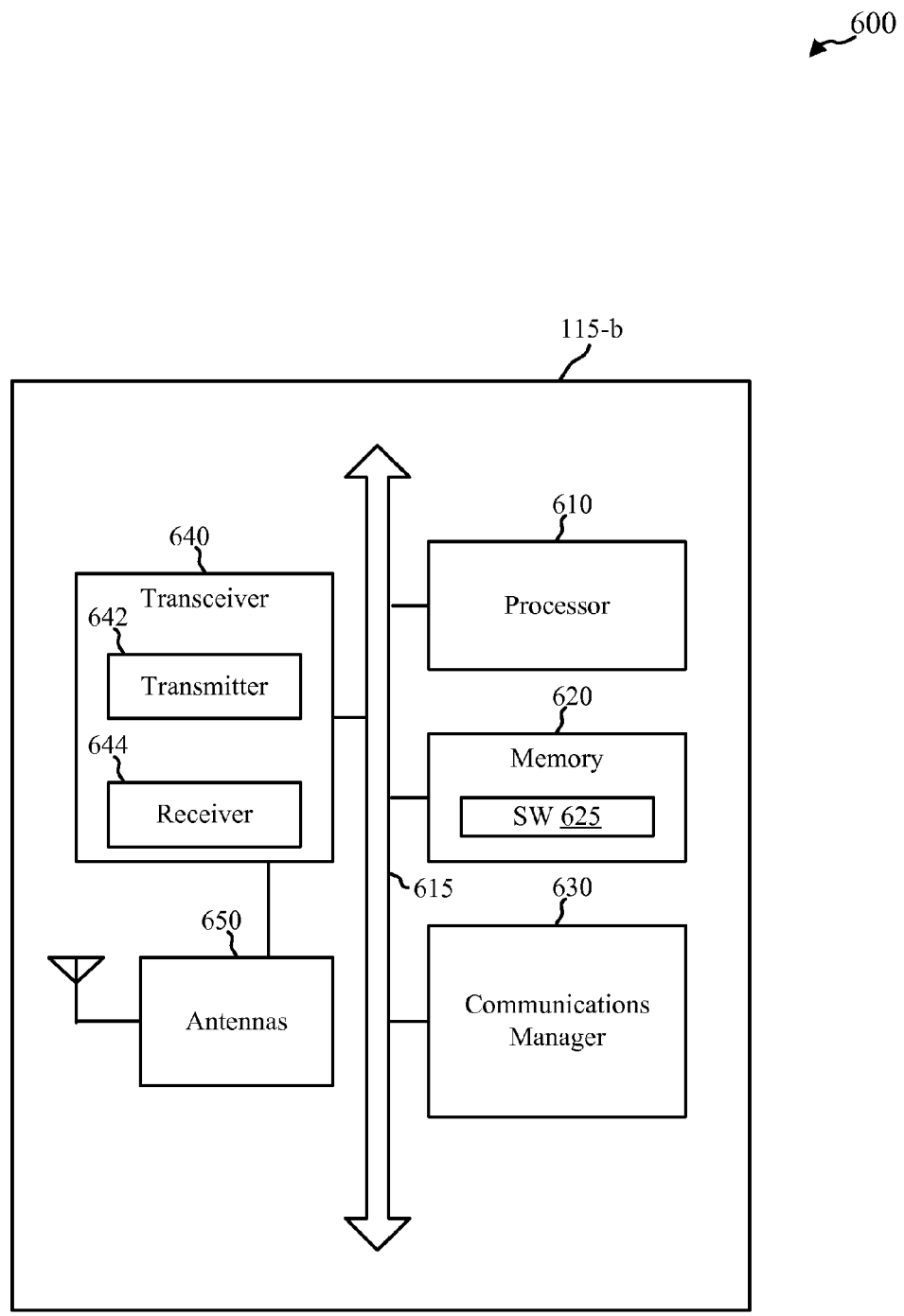
FIG. 6 shows a block diagram that illustrates an example of a device for receiving FM broadcasting according to various embodiments.

FIG. 6 shows a diagram 600 that illustrates a terminal or station 115-b configured to receive RF broadcast signals (e.g., audio and/or data signals) and process those signals using an adaptive FM demodulator configured to support multiple demodulation modes. The station 115-b may have various other configurations and may be included or be a part of a personal computer (e.g., laptop computer, netbook computer, tablet computer, etc.), a cellular telephone, a PDA, a digital video recorder (DVR), an internet appliance, a gaming console, an e-readers, etc. The station 115-b may have an internal power supply (not shown), such as a small battery, to facilitate mobile operation. The station 115-b may be an example of the stations 115 and 115-a of FIGS. 1 and/or 2. The station 115-b may be configured to implement at least some of the features and functions described above with respect to FIGS. 1-5.

The station 115-b may include a processor 610, a memory 620, a transceiver 640, and antennas 650. The transceiver 640 may include a transmitter 642 and a receiver 644. The receiver 644 may be an example of the FM receivers 210 and 210-a of FIGS. 2 and/or 3. Each of these components may be in communication with each other, directly or indirectly, over one or more buses 615.

The memory 620 may include random access memory (RAM) and read-only memory (ROM). The memory 620 may store computer-readable, computer-executable software (SW) code 625 containing instructions that are configured to, when executed, cause the processor 610 to perform various functions described herein for handling wireless communications and/or processing of FM broadcast signals using one of multiple demodulation modes supported by the station 115-b. Alternatively, the software code 625 may not be directly executable by the processor 610 but be configured to cause the computer (e.g., when compiled and executed) to perform functions described herein.

The processor 610 may include an intelligent hardware device, e.g., a central processing unit (CPU), a microcontroller, an ASIC, etc. The processor 610 may process information received through the transceiver 640 (e.g., via the receiver 644). The processor 610 may process information to be sent to the transceiver 640 for transmission through the antennas 650 (e.g., via the transmitter 642). The processor 610 may handle, alone or in connection with other components of the station 115-b, various aspects for handling wireless communications and/or processing of FM broadcast signals using one of multiple demodulation modes supported by the station 115-b.

The transceiver 640 may be configured to receive RF signals from a transmitter (e.g., transmitter 105). Moreover, the transceiver 640 may be configured to communicate bi-directionally with a base station, access point, or other similar network device. The transceiver 640 may be implemented as one or more transmitters and one or more separate receivers. As described above, the transceiver 640 in this example is shown to include the transmitter 642 and the receiver 644. The transceiver 640 may support communications with a WLAN or Wi-Fi network, and/or with a cellular network. The transceiver 640 may include a modem configured to modulate the packets and provide the modulated packets to the antennas 650 for transmission, and to demodulate packets received from the antennas 650 (e.g., FM demodulators 330, 330-a).

According to the architecture of FIG. 6, the station 115-b may further include a communications manager 630. The communications manager 630 may manage communications with various network devices (e.g., base stations, access points) and/or the reception of FM broadcasts from an FM transmitter (e.g., transmitter 105). The communications manager 630 may be a component of the station 115-b in communication with some or all of the other components of the station 115-b over the one or more buses 615. Alternatively, functionality of the communications manager 630 may be implemented as a component of the transceiver 640, as a computer program product, and/or as one or more controller elements of the processor 610.

Figure 7:
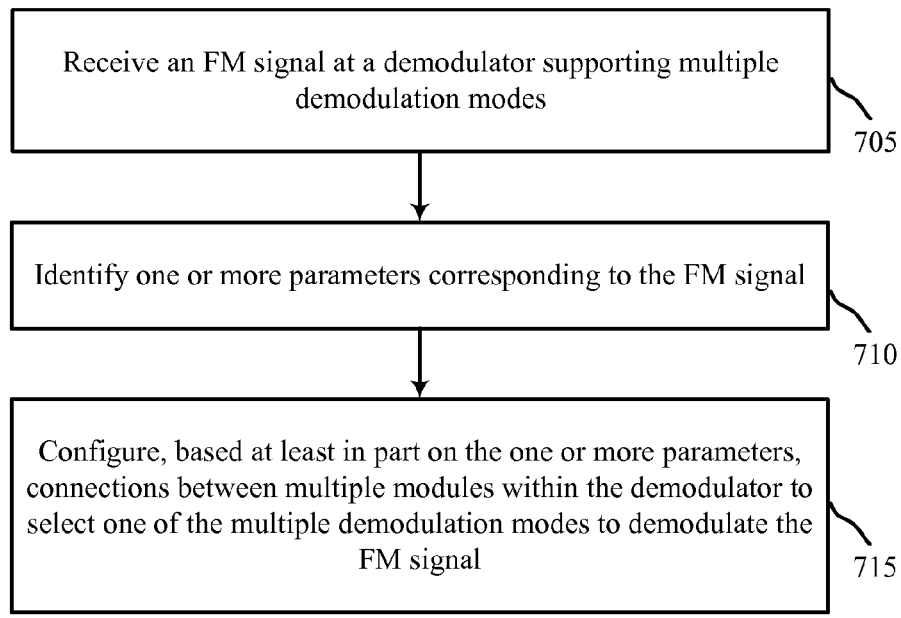
FIGS. 7-9 are flowcharts of examples of methods for adapting an FM demodulator according to various embodiments.

FIG. 7 is a flow chart illustrating an example of a method 700 for wireless communications in which an adaptive FM demodulator that supports multiple modes is used. For clarity, the method 700 is described below with reference to one of the stations, receivers, demodulators, devices, and modules shown in FIGS. 1, 2, 3, 4A, 4B, 4C, 4D, 5, and/or 6. In one embodiment, one of the stations may execute one or more sets of codes to control the functional elements of the station to perform the functions described below.

At block 705, an FM signal is received at a demodulator (e.g., FM demodulators 330, 330-a) supporting multiple demodulation modes (e.g., configurations in FIGS. 4B, 4C, and 4D).

At block 710, one or more parameters corresponding to the FM signal are identified (e.g., by maximum frequency deviation estimator 335, Signal strength estimator 360, parameter identifier 510).

At block 715, based at least in part on the one or more parameters, connections between multiple modules within the demodulator are configured (e.g., by controllers 350, 350-a and/or switches 440, 480) to select one of the multiple demodulation modes to demodulate the FM signal.

In some embodiments of the method 700, the multiple demodulation modes include two or more of a phase differencing mode, a PLL mode, an FCF mode, and a quadrature detector mode. In some embodiments, configuring connections between multiple modules within the modulator includes switching the demodulation mode selection from a phase differencing mode to a PLL mode. In some embodiments, the multiple demodulation modes include a quadratic FM mode. Configuring connections between multiple modules within the demodulator may also include switching the demodulation mode selection from a phase differencing mode to an FCF mode. The one or more parameters identified from the FM signal may include one or both of a signal strength metric (e.g., SINR) of the FM signal and a maximum frequency deviation of the FM signal.

In some embodiments of the method 700, one or more signals (e.g., control 1, control 2) are generated (e.g., by controllers 350, 350-*a*, control signal generator 540) based at least in part on the one or more parameters, and the connections between multiple modules within the demodulator for demodulating the FM signal are then configured based at least in part on the one or more signals. In some embodiments, the method further include comparing (e.g., by comparator 520) one of the one or more parameters to a threshold value, and switching the demodulation mode selection when the parameter breaches the threshold value.

In some embodiments of the method 700, configuring connections between multiple modules within the demodulator includes selecting a phase differencing mode to demodulate the FM signal, and configuring a signal processing path within the demodulator to demodulate the FM signal, where the signal processing path includes a normalizer (e.g., normalizer 410), an arc tangent module (e.g., ATAN 450), and a phase differentiator (e.g., phase differentiator 460). In this embodiment, the normalizer is communicatively coupled with the arc tangent module and the arc tangent module is communicatively coupled with the phase differentiator.

In some embodiments of the method 700, configuring connections between multiple modules within the demodulator includes selecting a PLL mode to demodulate the FM signal, and configuring a signal processing path within the demodulator to demodulate the FM signal, where the signal processing path includes a normalizer (e.g., normalizer 410), a multiplier (e.g., multiplier 420), an arc tangent module (e.g., ATAN 450), a PLL loop filter (e.g., PLL loop filter 470), and an NCO (e.g., NCO 490). In this embodiment, the normalizer is communicatively coupled with the multiplier, the multiplier is communicatively coupled with the arc tangent module, the arc tangent module is communicatively coupled with the PLL loop filter, the PLL loop filter is communicatively coupled with the NCO, and the NCO is communicatively coupled with the multiplier.

Figure 8:
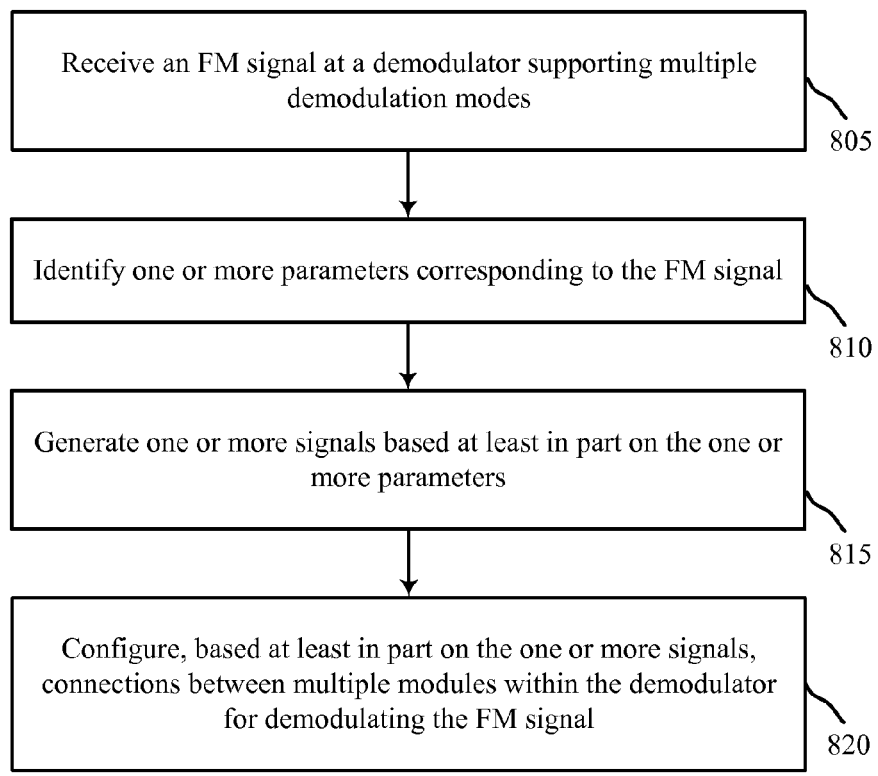

In some embodiments of the method 700, configuring connections between multiple modules within the demodulator includes selecting an FCF mode to demodulate the FM signal, and configuring a signal processing path within the demodulator to demodulate the FM signal, where the signal processing path comprising a normalizer (e.g., normalizer 410), a multiplier (e.g., multiplier 420), an adaptive channel filter (e.g., adaptive channel filter 430), an arc tangent module (e.g., ATAN 450), a phase differentiator (e.g., phase differentiator 460), and an NCO (e.g., NCO 490). In this embodiment, the normalizer is communicatively coupled with the multiplier, the multiplier is communicatively coupled with the adaptive channel filter, the adaptive channel filter is communicatively coupled with the arc tangent module, the arc tangent module is communicatively coupled with the phase differentiator, the phase differentiator is communicatively coupled with the NCO, and the NCO is communicatively coupled with the multiplier FIG. 8 is a flow chart illustrating an example of a method 800 for wireless communications in which an adaptive FM demodulator is used that supports multiple modes. For clarity, the method 800 is described below with reference to one of the stations, receivers, demodulators, devices, and modules shown in FIGS. 1, 2, 3, 4A, 4B, 4C, 4D, 5, and/or 6. In one embodiment, one of the stations may execute one or more sets of codes to control the functional elements of the station to perform the functions described below.

At block 805, an FM signal is received at a demodulator (e.g., FM demodulators 330, 330-*a*) supporting multiple demodulation modes (e.g., configurations in FIGS. 4B, 4C, 4D).

At block 810, one or more parameters corresponding to the FM signal are identified (e.g., by maximum frequency deviation estimator 335, signal strength estimator 360, parameter identifier 510).

At block 815, one or more signals (e.g., control 1, control 2) are generated based at least in part on the one or more parameters.

At block 820, based at least in part on the one or more signals, connections between multiple modules within the demodulator are configured (e.g., by controllers 350, 350-*a* and/or switches 440, 480) to select on of the multiple demodulation modes to demodulate the FM signal.

Figure 9:
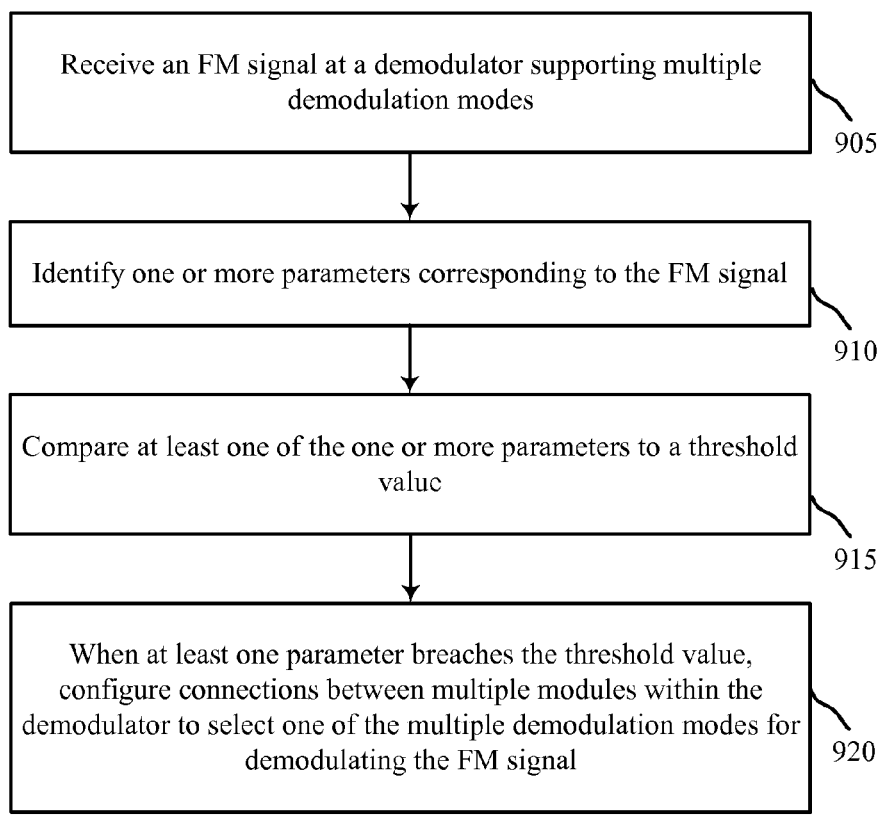

FIG. 9 is a flow chart illustrating an example of a method 900 for wireless communications in which an adaptive FM demodulator that supports multiple modes is used. For clarity, the method 900 is described below with reference to one of the stations, receivers, demodulators, devices, and modules shown in FIGS. 1, 2, 3, 4A, 4B, 4C, 4D, 5, and/or 6. In one embodiment, one of the stations may execute one or more sets of codes to control the functional elements of the station to perform the functions described below.

At block 905, an FM signal is received at a demodulator (e.g., FM demodulators 330, 330-*a*) supporting multiple demodulation modes (e.g., configurations in FIGS. 4B, 4C, 4D).

At block 910, one or more parameters corresponding to the FM signal are identified (e.g., by maximum frequency deviation estimator 335, signal strength estimator 360, parameter identifier 510).

At block 915, at least one of the one or more parameters is compared to a threshold value (e.g., by comparator 520).

At block 920, when the at least one parameter breaches the threshold value, connections between multiple modules within the demodulator are configured (e.g., by controllers 350, 350-*a* and/or switches 440, 480) to select one of the multiple demodulation modes to demodulate the FM signal.

Thus, the methods 700, 800, and 900 may provide for wireless communications. It should be noted that each of the methods 700, 800, and 900 is just one implementation and that the operations of the methods 700, 800, and 900 may be rearranged or otherwise modified such that other implementations are possible. In some instances, the operations of two or more of the methods 700, 800, and 900 may be combined to produce other implementations.

The detailed description set forth above in connection with the appended drawings describes exemplary embodiments and does not represent the only embodiments that may be implemented or that are within the scope of the claims. The term "exemplary" used throughout this description means "serving as an example, instance, or illustration," and not "preferred" or "advantageous over other embodiments." The detailed description includes specific details for the purpose of providing an understanding of the described techniques. These techniques, however, may be practiced without these specific details. In some instances, well-known structures and devices are shown in block diagram form in order to avoid obscuring the concepts of the described embodiments.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an ASIC, a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Throughout this disclosure the term "example" or "exemplary" indicates an example or instance and does not imply or require any preference for the noted example. Thus, the disclosure is not to be limited to the examples and designs described herein but is to be accorded the widest scope consistent with the principles and novel features disclosed herein.

What is claimed is:

1. A method for wireless communications, comprising:
   receiving a frequency modulated (FM) signal at a demodulator supporting multiple demodulation modes;
   identifying one or more parameters corresponding to the FM signal; and
   configuring, based at least in part on the one or more parameters, connections between multiple modules within the demodulator to select one of the multiple demodulation modes to demodulate the FM signal.

2. The method of claim 1, wherein the multiple demodulation modes comprise two or more of a phase differencing mode, a phase-locked loop (PLL) mode, a frequency-compressive feedback (FCF) mode, and a quadrature detector mode.

3. The method of claim 1, wherein the one or more parameters comprise one or both of a signal strength metric of the FM signal and a maximum frequency deviation of the FM signal.

4. The method of claim 1, further comprising:
   generating one or more signals based at least in part on the one or more parameters; and
   configuring the connections between multiple modules within the demodulator for demodulating the FM signal based at least in part on the one or more signals.

5. The method of claim 1, further comprising:
   comparing one of the one or more parameters to a threshold value; and
   switching the demodulation mode selection when the parameter breaches the threshold value.

6. The method of claim 1, wherein the multiple demodulation modes comprise a quadratic FM mode.

7. The method of claim 1, wherein configuring connections between multiple modules within the demodulator comprises:
   selecting a phase differencing mode to demodulate the FM signal; and
   configuring a signal processing path within the demodulator to demodulate the FM signal, the signal processing path comprising an arc tangent module and a phase differentiator.

8. The method of claim 1, wherein configuring connections between multiple modules within the demodulator comprises:
   selecting a PLL mode to demodulate the FM signal; and
   configuring a signal processing path within the demodulator to demodulate the FM signal, the signal processing path comprising a phase discriminator, a PLL loop filter, and a numerically-controlled oscillator (NCO).

9. The method of claim 1, wherein configuring connections between multiple modules within the demodulator comprises:

selecting an FCF mode to demodulate the FM signal; and configuring a signal processing path within the demodulator to demodulate the FM signal, the signal processing path comprising a multiplier, an adaptive channel filter, an arc tangent module, a phase differentiator, and a numerically-controlled oscillator (NCO).

10. An apparatus for wireless communications, comprising:

means for demodulating a frequency modulated (FM) signal, wherein the means for demodulating supports multiple demodulation modes;

means for identifying one or more parameters corresponding to the FM signal; and means for configuring, based at least in part on the one or more parameters, connections between multiple modules within the means for demodulating to select one of the multiple demodulation modes to demodulate the FM signal.

11. The apparatus of claim 10, wherein the multiple demodulation modes comprise two or more of a phase differencing mode, a phase-locked loop (PLL) mode, a frequency-compressive feedback (FCF) mode, and a quadrature detector mode.

12. The apparatus of claim 10, wherein the one or more parameters comprise one or both of a signal strength metric of the FM signal and a maximum frequency deviation of the FM signal.

13. The apparatus of claim 10, comprising:

means for generating one or more signals based at least in part on the one or more parameters; and means for configuring the connections between multiple modules within the means for demodulating in order to demodulate the FM signal based at least in part on the one or more signals.

14. The apparatus of claim 10, comprising:

means for comparing one of the one or more parameters to a threshold value; and means for switching the demodulation mode selection when the parameter breaches the threshold value.

15. The apparatus of claim 10, wherein the multiple demodulation modes comprise a quadratic FM mode.

16. An apparatus for wireless communications, comprising:

a processor;

memory in electronic communication with the processor; and instructions stored in the memory, the instructions being executable by the processor to:

receive a frequency modulated (FM) signal at a demodulator supporting multiple demodulation modes;

identify one or more parameters corresponding to the FM signal; and configure, based at least in part on the one or more parameters, connections between multiple modules within the demodulator to select one of the multiple demodulation modes to demodulate the FM signal.

17. The apparatus of claim 16, wherein the multiple demodulation modes comprise two or more of a phase differencing mode, a phase-locked loop (PLL) mode, a frequency-compressive feedback (FCF) mode, and a quadrature detector mode.

18. The apparatus of claim 16, wherein the one or more parameters comprise one or both of a signal strength metric of the FM signal and a maximum frequency deviation of the FM signal.

19. The apparatus of claim 16, wherein the instructions are executable by the processor to:

generate one or more signals based at least in part on the one or more parameters; and configure the connections between multiple modules within the demodulator for demodulating the FM signal based at least in part on the one or more signals.

20. The apparatus of claim 16, wherein the instructions are executable by the processor to:

compare one of the one or more parameters to a threshold value; and switch the demodulation mode selection when the parameter breaches the threshold value.

21. A computer program product for wireless communications, the computer program product comprising a non-transitory computer readable medium, the computer readable medium storing instructions thereon, the instructions being executable by a processor to:

receive a frequency modulated (FM) signal at a demodulator supporting multiple demodulation modes;

identify one or more parameters corresponding to the FM signal; and configure, based at least in part on the one or more parameters, connections between multiple modules within the demodulator to select one of the multiple demodulation modes to demodulate the FM signal.

22. The computer program product of claim 21, wherein the instructions are executable by the processor to:

generate one or more signals based at least in part on the one or more parameters; and configure the connections between multiple modules within the demodulator for demodulating the FM signal based at least in part on the one or more signals.

23. The computer program product of claim 21, wherein the instructions are executable by the processor to:

compare one of the one or more parameters to a threshold value; and switch the demodulation mode selection when the parameter breaches the threshold value.

* * * * *